US008665996B2

(12) United States Patent
Zanotelli et al.

(10) Patent No.: US 8,665,996 B2
(45) Date of Patent: Mar. 4, 2014

(54) EFFICIENT PARALLEL SUB-PACKET DECODING USING MULTIPLE DECODERS

(75) Inventors: Joseph Zanotelli, San Diego, CA (US);
Mrinal Mahesh Nath, San Diego, CA (US); Arunava Chaudhuri, San Diego, CA (US); Kaushik Ghosh, San Diego, CA (US); Raghu Challa, San Diego, CA (US); Weihong Jing, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 1130 days.

(21) Appl. No.: 12/400,124

(22) Filed: Mar. 9, 2009

(65) Prior Publication Data
US 2009/0245430 A1 Oct. 1, 2009

Related U.S. Application Data

(60) Provisional application No. 61/041,558, filed on Apr. 1, 2008.

(51) Int. Cl.
*H04L 27/06* (2006.01)
(52) U.S. Cl.
USPC ........... 375/340; 375/341; 375/324; 375/347; 375/349; 375/356; 375/262; 375/265; 375/253
(58) Field of Classification Search
USPC ......... 375/340, 253, 262, 265, 341, 324, 347, 375/349, 353, 356
See application file for complete search history.

(56) References Cited

U.S. PATENT DOCUMENTS

| 6,263,023 B1 | 7/2001 | Ngai |
| 6,996,767 B2 | 2/2006 | Chang et al. |
| 7,227,589 B1 | 6/2007 | Yeo et al. |

(Continued)

FOREIGN PATENT DOCUMENTS

| CN | 1523895 A | 8/2004 |
| EP | 1161097 A1 | 12/2001 |

(Continued)

OTHER PUBLICATIONS

International Search Report & Written Opinion—PCT/US2009/036709, International Search Authority—European Patent Office—Oct. 27, 2009.

(Continued)

*Primary Examiner* — Kabir A Timory
(74) *Attorney, Agent, or Firm* — Abdollah Katbab

(57) ABSTRACT

A configurable decoder within a receiver (for example, within a wireless communication device) includes numerous decoders. In one mode, the multiple decoders are used to decode different sub-packets of a packet. When one decoder completes decoding the last sub-packet assigned to it of the packet, then that decoder generates a packet done indication. A control circuit receives the packet done indications, and when all the decoders have generated packet done indications then the control circuit initiates an action. In one example, the action is the interrupting of a processor. The processor responds by reading status information from the control circuit, thereby resetting the interrupt. End-of-packet markers are usable to generate packet done indications and to generate EOP interrupts. Similarly, end-of-group markers are usable to generate group done indications and to generate EOG interrupts. The decoder block is configurable to process sub-packets of a packet using either one or multiple decoders.

57 Claims, 9 Drawing Sheets

MULTI-DECODER CIRCUIT

(56) References Cited

U.S. PATENT DOCUMENTS

| | | |
|---|---|---|
| 7,720,017 B2 | 5/2010 | Khan |
| 8,363,624 B2 | 1/2013 | Blanz et al. |
| 2007/0222647 A1* | 9/2007 | Hamamoto .................. 341/50 |
| 2009/0132893 A1 | 5/2009 | Miyazaki et al. |

FOREIGN PATENT DOCUMENTS

| | | |
|---|---|---|
| JP | 2001196943 A | 7/2001 |
| JP | 2004519886 A | 7/2004 |
| JP | 2007006382 A | 1/2007 |
| WO | WO9509394 A1 | 4/1995 |
| WO | WO02067435 A1 | 8/2002 |
| WO | 2006099528 A1 | 9/2006 |
| WO | WO2006123908 | 11/2006 |
| WO | 2007101041 | 9/2007 |
| WO | 2008015742 A1 | 2/2008 |

OTHER PUBLICATIONS

Invitation to Pay Additional Fees—PCT/US2009/036709, International Search Authority—European Patent Office—Jul. 31, 2009.

Liu X., Papaefthymiou M. C : "Design of a High-Throughput Low-Power IS95 Viterbi Decoder" Proceedings of the 39th ACM/IEEE Design Automation Conference (DAC), Jun. 2002, pp. 263-268, XP040135445 ACM, 2 Penn Plaza, Suite 701—New York USA p. 263, paragraph Abstract p. 265, right-hand column, paragraph 4—p. 266, right-hand col. p. 267, left-hand column, paragraph 6—right-hand col. figures 5,6,8.

Wei Han et al: "Multi-core Architectures with Dynamically Reconfigurable Array Processors for the WiMAX Physical Layer" Application Specific Processors, 2008. SASP 2008. Symposium on, IEEE, Piscataway, NJ, USA, Jun. 8, 2008, pp. 115-120, XP031289548 ISBN: 978-1-4244-2333-0 p. 115, paragraph Abstract p. 116, paragraph I I I—p. 119, paragraph V.B.

Taiwan Search Report—TW098109405—TIPO—Feb. 19, 2013.

Samsung: "Analysis of per code block CRC and per transport block CRC", 3GPP TSG RAN WG1#49-bis R1-073108, Jun. 20, 2007.

European Search Report—EP12005069—Search Authority—Munich—Aug. 24, 2012.

\* cited by examiner

DECODER OPERATION

MULTI-DECODER CIRCUIT

|   | 63 |  |  |  |  |  |  | 0 |
|---|----|--|--|--|--|--|--|---|
| 0 | OP | LENGTH | TIR | TASK INDEX |  | IM | AT | WALL CLOCK COUNT |
| 1 |  |  |  |  |  |  |  |  |
| 2 |  | K |  |  |  |  |  |  |
| 3 |  |  |  |  |  |  |  |  |
| 4 |  |  |  |  | A | B |  |  |
| 5 | D | E |  |  | C | H | L G F I |  |
| 6 |  |  |  | J |  |  |  |  |

A = DEC_LLR_SEG (3 BITS)
B = DEC_LLR_SEG_OFFSET (11 BITS)
C = DEC_SUBPKT_SIZE (16 BITS)
D = DEC_OB_DEST_ADDR (16 BITS)
E = DEC_RESOURCE_USE (2 BITS) -    00= SINGLE DECODER
                                   01= DUAL DECODER - GROUP
                                   10= DUAL DECODER - PACKET
F = DEC_EOP (1 BIT)
G = DEC_EOG (1 BIT)
H = DEC_SUBPKT_INDEX (6 BITS)
I = DEC_PKT_NUMBER (1 BIT)
J = DEC_INT_ENABLE (2 BITS)
K = DEC_SEL (3 BITS)
L = DEC_GEN_TX_ACK (1 BIT)

DDE EXECUTE TASK INSTRUCTION

FIG. 8

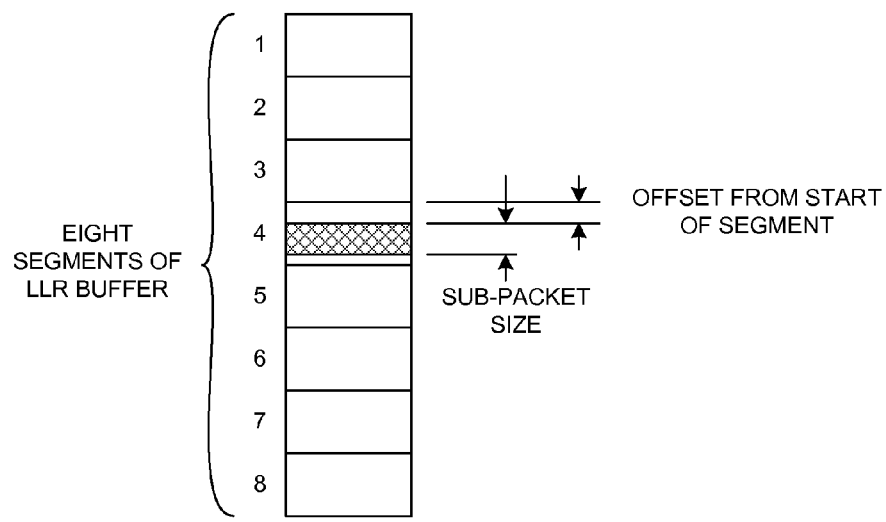

LLR BUFFER (SOURCE)

FIG. 9

SUB-PACKETS TO BE DEMODULATED

FIRST SCENARIO - DECODER#2 FINISHES FIRST

SECOND SCENARIO - DECODER#1 FINISHES FIRST

FIRST SCENARIO - DECODER#2 FINISHES FIRST

SECOND SCENARIO - DECODER#1 FINISHES FIRST

EFFICIENT PARALLEL SUB-PACKET DECODING USING MULTIPLE DECODERS

CROSS-REFERENCE TO RELATED APPLICATION

This application claims the benefit under 35 U.S.C. §119 of Provisional Application Ser. No. 61/041,558, filed Apr. 1, 2008, said provisional application is incorporated herein by reference.

BACKGROUND INFORMATION

1. Technical Field

The present disclosure relates to decoding in communication systems.

2. Background Information

FIG. 1 (Prior Art) is a diagram of one type of conventional wireless communication system that communicates packets. Packets 1 of data can be communicated from a first wireless communication device 2 to a second wireless communication device 3. Communication device 3 includes an antenna 4, a RF transceiver integrated circuit 5, and a digital baseband integrated circuit 6. Digital baseband integrated circuit 6 includes a number of parts including an Analog-to-Digital Converter (ADC) 7, a receive path 8, a Digital-to-Analog Converter (DAC) 9, a transmit path 10, an interrupt controller mechanism 11, and a processor 12. The incoming packets 1 are received on antenna 4, and pass through RF transceiver 5, and ADC 7, and into the receive path 8. Within the receive path 8, the packets pass through a number of processing blocks including a Fast Fourier Transform (FFT) processing block 13, a demodulator block 14, and a decoder block 15. The packets are often not communicated as complete packets, but rather the payload of the packet is broken into portions. Each portion may be called a "sub-packet". Each sub-packet may have its own Cyclic Redundancy Check (CRC) value that is usable to determine whether the data payload of the sub-packet has been received correctly. The data payloads of all the sub-packets may in turn be assembled, and the assembled payload may be checked using another CRC value. In the example of FIG. 1, the checking of CRC values occurs in decoder block 15.

FIG. 2 (Prior Art) illustrates a timeline of processing of a set of such sub-packets SP1-SP5 in decoder block 15 of FIG. 1. Each sub-packet has its own CRC value as illustrated. If all the sub-packets are properly received as determined in decoder block 15 using the CRC values, and if the overall packet data payload is determined to have been properly received by decoder block 15, then decoder block 15 interrupts the processor 12. Such an interrupt may, for example, be communicated via signal conductor 16 to interrupt controller 11 that in turn interrupts processor 12 in conventional fashion. Once interrupted, processor 12 handles the received packet of data as appropriate. It is generally not desirable to interrupt the processor frequently because interrupting the processor slows the processor from performing other tasks. Consequently, FIG. 2 shows only one interrupt being generated even though a sequence of sub-packets SP1-SP5 has been received. The interrupt is represented by vertical arrow 17. Over time, higher data throughput rates have been required in wireless communication systems. Supporting such higher data throughput rates has burdened the processing capabilities of various portions of the circuits of wireless communication devices such as devices 2 and 3. Solutions are desired.

SUMMARY

A configurable decoder block within a receiver (for example, within a receiver of a wireless communication device) includes a plurality of decoders. The decoders may, for example, be turbo decoders. In one configuration mode, the decoders are used to decode different sub-packets of a first packet. When one of the decoders completes decoding the last sub-packet assigned to it of the first packet, then that decoder generates a packet done indication but continues on decoding other sub-packets of a subsequent packet without halting. The multiple decoders cooperate in this way, decoding different sub-packets of the first packet without any of the decoders being halted. A control circuit receives the packet done indications from the various decoders working on the first packet, and only after all the decoders have generated packet done indications does the control circuit initiate an action. In one example, the action is the asserting of an interrupt signal supplied to a processor. The processor responds by reading status information (for example, Cyclic Redundancy Check (CRC) pass/fail information for each sub-packet of the first packet) from the control circuit. The reading resets the interrupt signal to its unasserted state so that the control circuit can generate another interrupt signal to alert the processor to another condition.

Within the decoder block, an individual decoder can be made to decode a sub-packet of information stored in particular source locations in an LLR buffer using source information in various fields of a task instruction. The task instruction also specifies destination locations in a decode output buffer where the results of the decode operation are to be written. The task instruction may also include an end-of-packet (EOP) marker that indicates whether or not the associated sub-packet is the last sub-packet of the packet (the last of the sub-packets of a particular packet to be decoded by the specified decoder). The task instruction also may include an end-of-group (EOG) marker that indicates whether or not the associated sub-packet is the last sub-packet of the group (the last of the sub-packets of a group of packets to be decoded by the specified decoder). Typically a decoder will execute a sequence of such task instructions such that a corresponding sequence of sub-packets is decoded by the decoder as specified by the task instructions. The decoders use the EOP and/or EOG markers to supply packet done indications and/or group done indications to the control circuit. The control circuit in turn uses the EOP and/or EOG indications to generate interrupt signals and to take other actions as determined by the configuration mode of the decoder block. The decoder block is configurable by the processor through the use of task instructions such that the decoder block processes sub-packets of a packet using a single decoder or using multiple decoders. In one example, the decoder is configurable to generate an interrupt signal at the end of decoding each sub-packet and/or to generate an interrupt signal at the end of decoding of a particular packet and/or to generate an interrupt signal at the end of decoding of an entire group of packets.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF THE DRAWINGS

FIG. 8 is a diagram of a DDE execute task instruction.

FIG. 9 is a diagram showing how fields of the DDE execute task instruction of FIG. 8 identify the location of a sub-packet in the LLR buffer 129 of FIG. 6.

DETAILED DESCRIPTION

Figure 1:
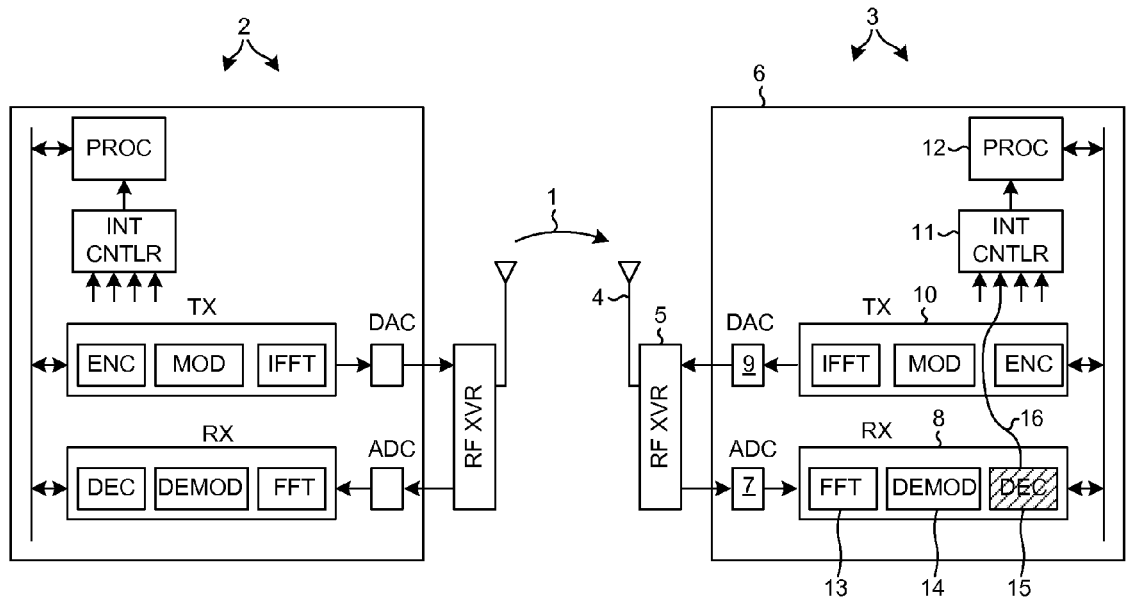
FIG. 1 (Prior Art) is a simplified block diagram illustrating a decoding operation being performed in a receiver of a wireless communication device.
Figure 2:
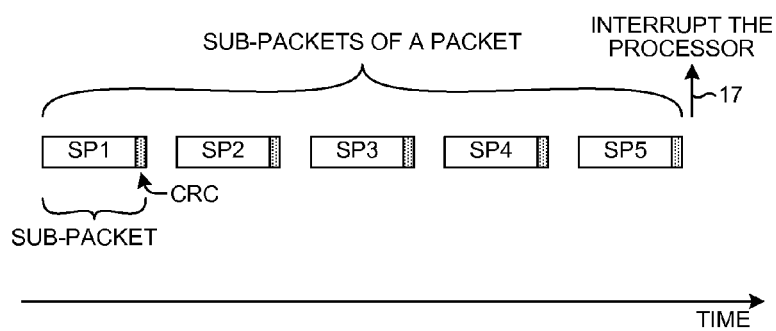
FIG. 2 (Prior Art) is a diagram that illustrates a sequence of sub-packets that is decoded by the receiver of FIG. 1.
Figure 3:
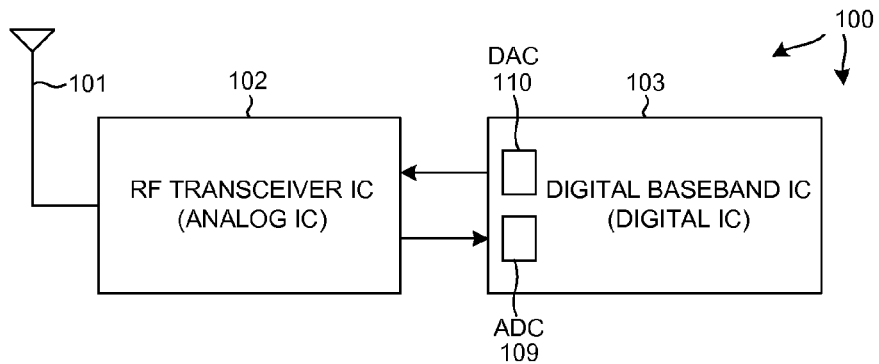
FIG. 3 is a very simplified high level block diagram of a mobile communication device in accordance with one novel aspect.

FIG. 3 is a simplified high level block diagram of an example of a wireless communication device 100. Wireless communication device 100 includes, among other parts not illustrated, an antenna 101, a Radio Frequency (RF) integrated circuit 102, and a digital baseband integrated circuit 103.

Figure 4:
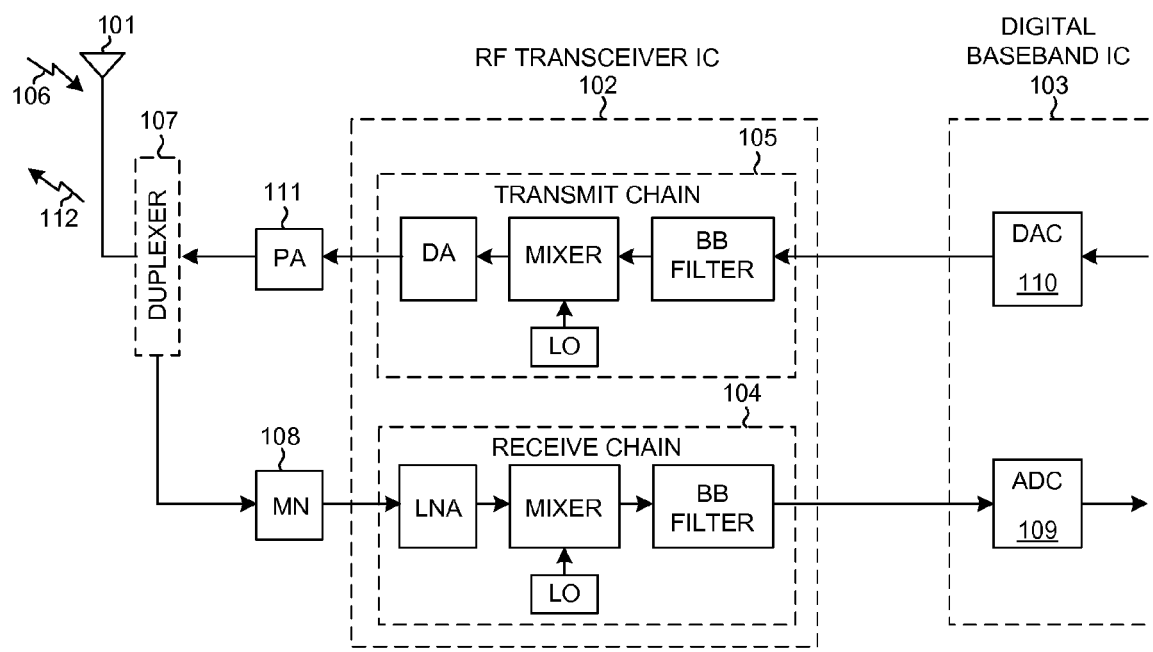
FIG. 4 is a more detailed block diagram of the RF transceiver integrated circuit 102 of the mobile communication device of FIG. 3.

FIG. 4 is a more detailed block diagram of the antenna 101 and the RF transceiver integrated circuit 102 of FIG. 3. The RF transceiver integrated circuit 102 includes a receive chain 104 and a transmit chain 105. An incoming transmission 106 is received on antenna 101, and passes through a duplexer 107 and a matching network 108 and into the receive chain 104. After being downconverted in frequency in receive chain 104, the received signal passes to an Analog-to-Digital Converter (ADC) 109 in the digital baseband integrated circuit 103 for further processing. If wireless communication device 100 is to make a transmission, then digital information is converted into analog form by a Digital-to-Analog Converter (DAC) 110 in the digital baseband integrated circuit 103. The resulting analog signal is then upconverted in frequency by transmit chain 105 of the RF transceiver integrated circuit 102, and the resulting RF signal is amplified by power amplifier PA 111. The amplified signal passes through duplexer 107 and to antenna 101 for transmission as outgoing transmission 112.

Figure 5:
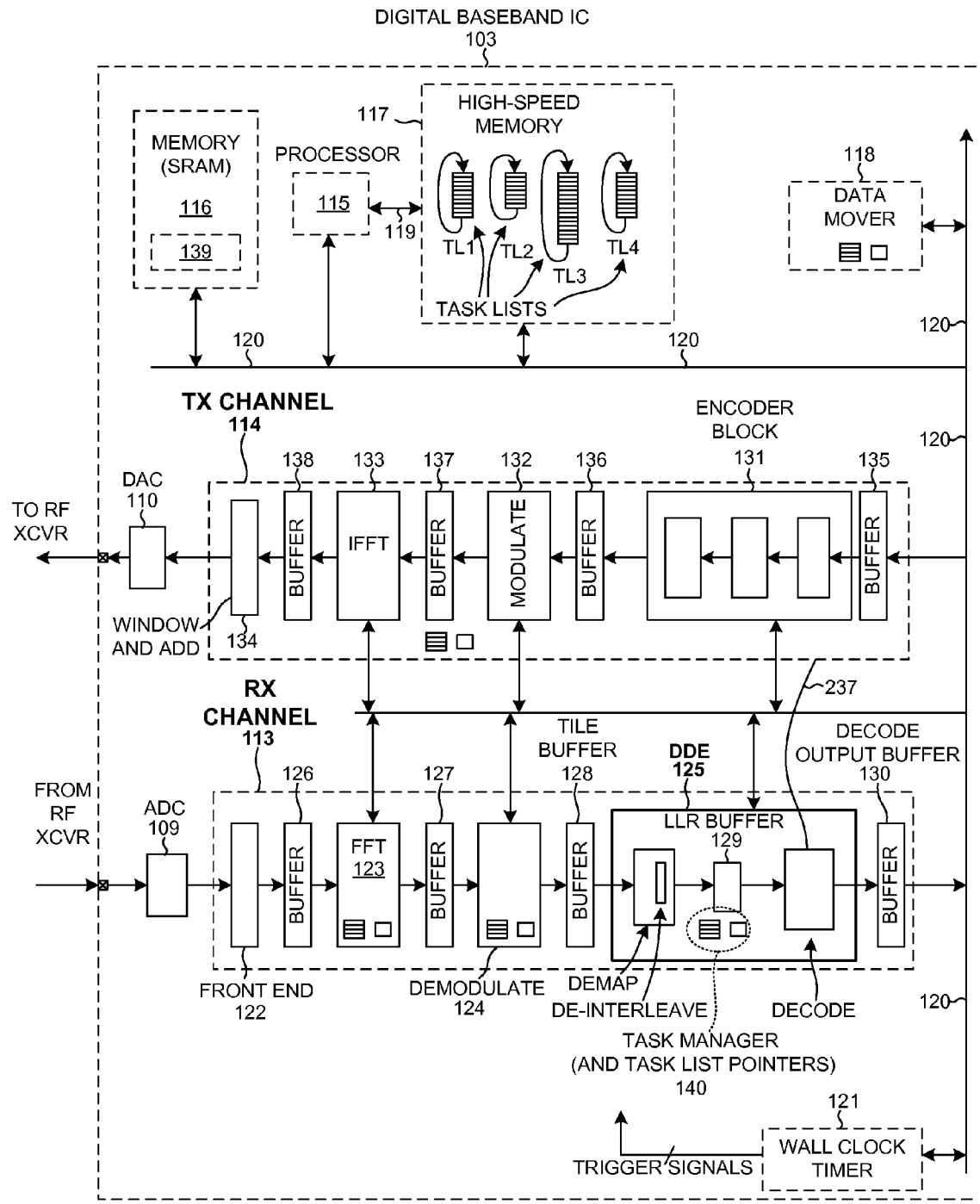
FIG. 5 is a more detailed diagram of the digital baseband integrated circuit 103 of the mobile communication device of FIG. 3.

FIG. 5 is a more detailed block diagram of digital baseband integrated circuit 103 of FIG. 3. Digital baseband integrated circuit 103 includes, among other portions not illustrated, ADC 109, a receive channel 113, a transmit channel 114, DAC 110, a processing circuit 115, an amount of memory 116, an amount of high-speed memory 117, a data mover engine 118, a first bus 119, a second bus 120, and a wall clock timer 121. Receive channel 113 in turn includes a set of processing blocks 122-125, referred to here as Wireless Communication System Modem Sub-Circuits (WCSMSCs). The WCSMSCs are organized in a chain to process a stream of incoming data. These WCSMSCs include a front end WCSMSC 122, a Fast Fourier Transform (FFT) WCSMSC 123, a demodulate WCSMSC 124, and a Demap/De-Interleave/Decode (DDE) WCSMSC 125. DDE WCSMSC 125 in turn includes a demapper portion, an LLR buffer 129, and a decoder block as explained below in further detail. Data flow passing through the various WCSMSCs of the receive channel 113 is buffered by buffers 126-130. The general path of receive channel data is from left to right in FIG. 5 through circuits 109, 122, 126, 123, 127, 124, 128, 125, 130 to second bus 120. Similarly, transmit channel 114 includes a corresponding set of WCSMSCs 131-134 and buffers 135-138. The general path of transmit channel data is from right to left in FIG. 5 from second bus 120, to 135, 131, 136, 132, 137, 133, 138, 134, and 110.

Processing circuit 115 may include multiple processors. Processing circuit 115 executes a program 139 of processor-executable instructions stored in memory 116. High-speed memory 117, first bus 119 and processing circuit 115 together form a Tightly Coupled Memory (TCM) system. Processing circuit 115 can read from and write to high-speed memory 117 across first bus 119.

In this example, processing circuit 115 controls the various sub-circuits 122-125 and 131-134 of the receive and transmit channels using what are called "task lists". A task list includes one or more task instructions. In the illustration, four task lists TL1, TL2, TL3 and TL4 are shown stored in memory 117. Task list TL1 contains task instructions for the transmit channel 114. Task list TL2 contains task instructions for FFT WCSMSC 123. Task list TL3 contains task instructions for DEMOD WCSMSC 124. Task list TL4 contains task instructions for DDE WCSMSC 125. Each task list contains a sequence of task instructions for execution by an associated sub-circuit. The sub-circuit includes a task manager circuit that is coupled to second bus 120 as well as an amount of dedicated functional circuitry for performing the data processing operation of the circuit. The task manager reads a task instruction from its associated task list, and interprets an opcode and various fields of the task instruction, and then controls the associated hardware of the dedicated functional circuitry to perform an operation as indicated by the task instruction. By placing appropriate task instructions into the task list for a particular sub-circuit, processing circuit 115 can cause the dedicated functional circuitry of a particular sub-circuit to perform a particular operation specified by the processing circuit. Processing circuit 115 can write task instructions into these task lists, modify these task lists, delete task lists, and otherwise maintain the task lists as desired via first bus 119. Each task list is maintained in memory 117 in a circular buffer. The task manager for DDE WCSMSC 125 in FIG. 5 is identified by reference numeral 140. The associated dedicated functional circuitry controlled by task manager 140 includes the demapper block and the deocoder block.

Figure 6:
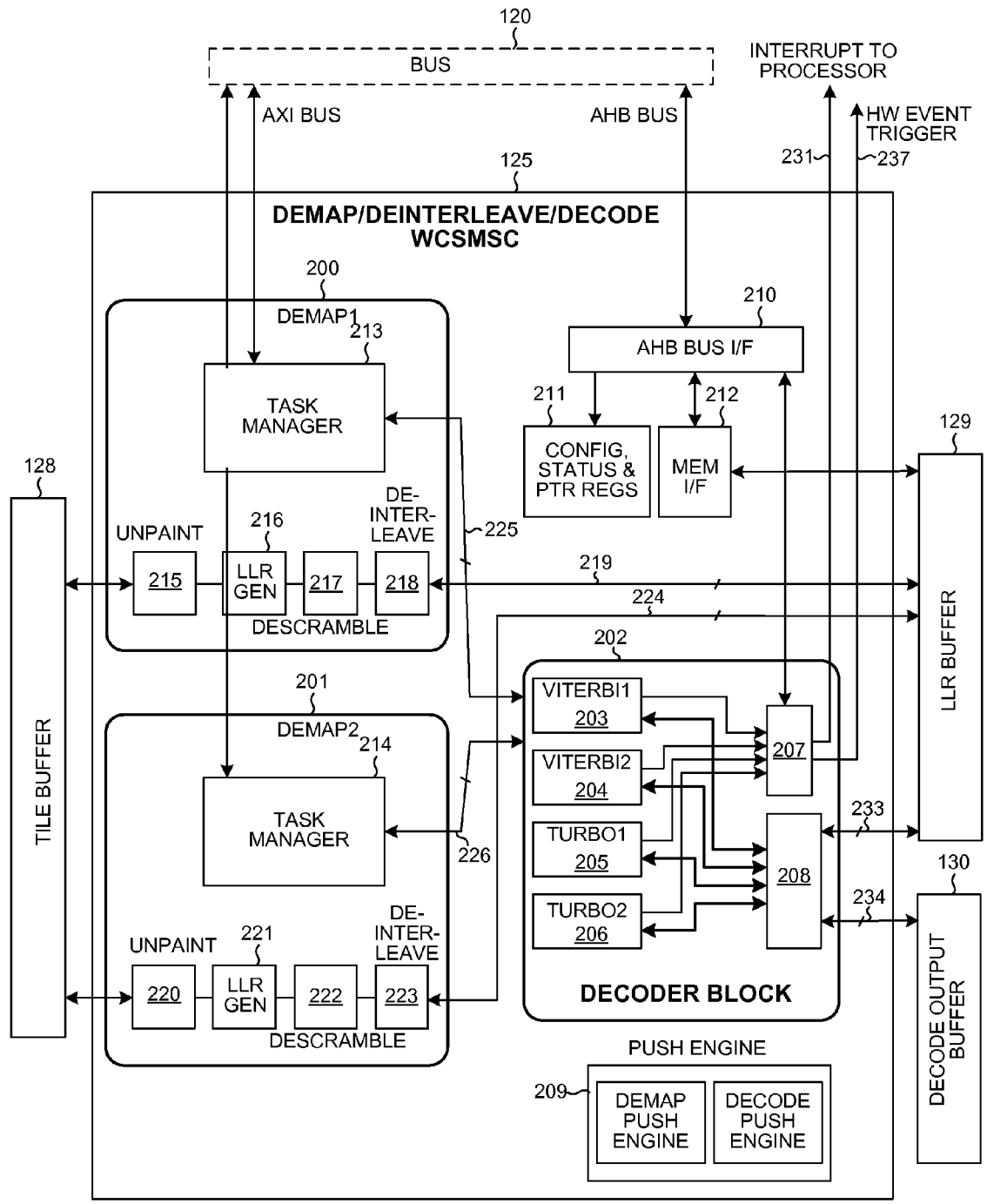
FIG. 6 is a more detailed diagram of the demap/de-interleave/decode (DDE) Wireless Communication System Modem Sub-Circuit (WCSMSC) 125 of FIG. 5.

FIG. 6 is a more detailed block diagram of DDE WCSMSC 125 of FIG. 4. The demapper block of DDE WCSMSC 125 actually includes two demap circuits 200 and 201. The decoder block 202 of DDE WCSMSC 125 includes two Viterbi decoders 203 and 204, two turbo decoders 205 and 206, a configurable flow control circuit 207, and memory interface circuitry 208. In addition to the demap and decoder blocks, DDE WCSMSC 125 includes a push engine 209, a bus interface 210 for interfacing to second bus 120, a set of configuration, status and pointer registers 211, and a memory interface 212. The task manager 140 of FIG. 5 is distributed into task manager blocks 213 and 214 and registers 211. The overall task manager functionality receives task instructions. Some of these task instructions include fields for controlling demap circuit 200 and those fields are interpreted and used by task manager portion 213, whereas other fields are for controlling demap circuit 201 and those fields are interpreted and used by task manager portion 214. Processing circuit 115 of FIG. 5 generally writes a task instruction onto task list TL4 for DDE WCSMSC 125, and then performs a single write across second bus 120 and AHB bus interface 210 into register block 211 to update a WR_PTR pointer value stored in block 211. The task manager portions 213 and 214 detect that the WR_PTR pointer value in the register in block 211 now points to a location in the TL4 circular buffer in memory 117 (see FIG. 5) after the last task instruction executed. The task manager portions therefore read the next task instruction of TL4 across second bus 120, and then interpret and execute the task instruction. The task manager portions of DDE WCSMSC 125 maintain an EXEC_PTR pointer in another register in register block 211. The value of the EXEC_PTR pointer indicates the last task instruction in task list TL4 that has been executed.

Demap portion 200 of FIG. 6 is a relatively low throughput demap circuit used for control packets, whereas demap portion 201 is a relatively high throughput demap circuit used for data packets. Demap portion 200 includes the following functional blocks: an unpaint block 215, a Log-Likelihood Ratio (LLR) generator block 216, a descrambler block 217, and a de-interleaver block 218. Demap portion 200 interfaces to LLR buffer 129 via conductors 219 that provide two parallel read/write channels into and out of the LLR buffer. Higher throughput demap portion 201 includes the following functional blocks: an unpaint block 220, an LLR generator block 221, a descrambler block 222, and a de-interleaver block 223. Demap portion 201 interfaces to LLR buffer 129 via conductors 244 that provide six parallel read/write channels into and out of LLR buffer 129. LLR buffer 129 is a multi-banked memory that can simultaneously receive six LLR values from demap 201 and two LLR values from demap 200. Decoder block 202 reads LLR values out of LLR buffer 129 in de-interleaved order via conductors 233, performs decoding as specified by task instructions, and writes the resulting decoded data into decode output buffer 130 via conductors 234.

Once a demap/de-interleave/decode operation has been initiated, processing always proceeds through each successive step from the unpaint step, to LLR generation, to descrambling, to de-interleaving, to decoding. A separate task instruction for each of these steps is therefore not necessary to control the demap, de-interleave and decode aspects of processing. Rather, a single task instruction is used to control the entire sequence of processing through these steps. Once a demap block 200 or 201 has completed its portion of processing on a sub-packet, then the sub-packet is forwarded by the demap block to the decoder block along with status information associated with the sub-packet. Decoder block 202 then processes the received sub-packet as soon as possible. One of the demap blocks 200 and 201 forwards a sub-packet to decoder block 202 by first writing the sub-packet of LLR values into a portion of LLR buffer 129, and then informing decoder block 202 via conductors 225 or 226 of the location of the sub-packet in LLR buffer 129 and where the decoder block 202 should write the result of decoding into decode output buffer 130. The forwarding also involves the demap block forwarding status information associated with the sub-packet directly to the decoder block 202 via conductors 225 or 226.

Figure 7:
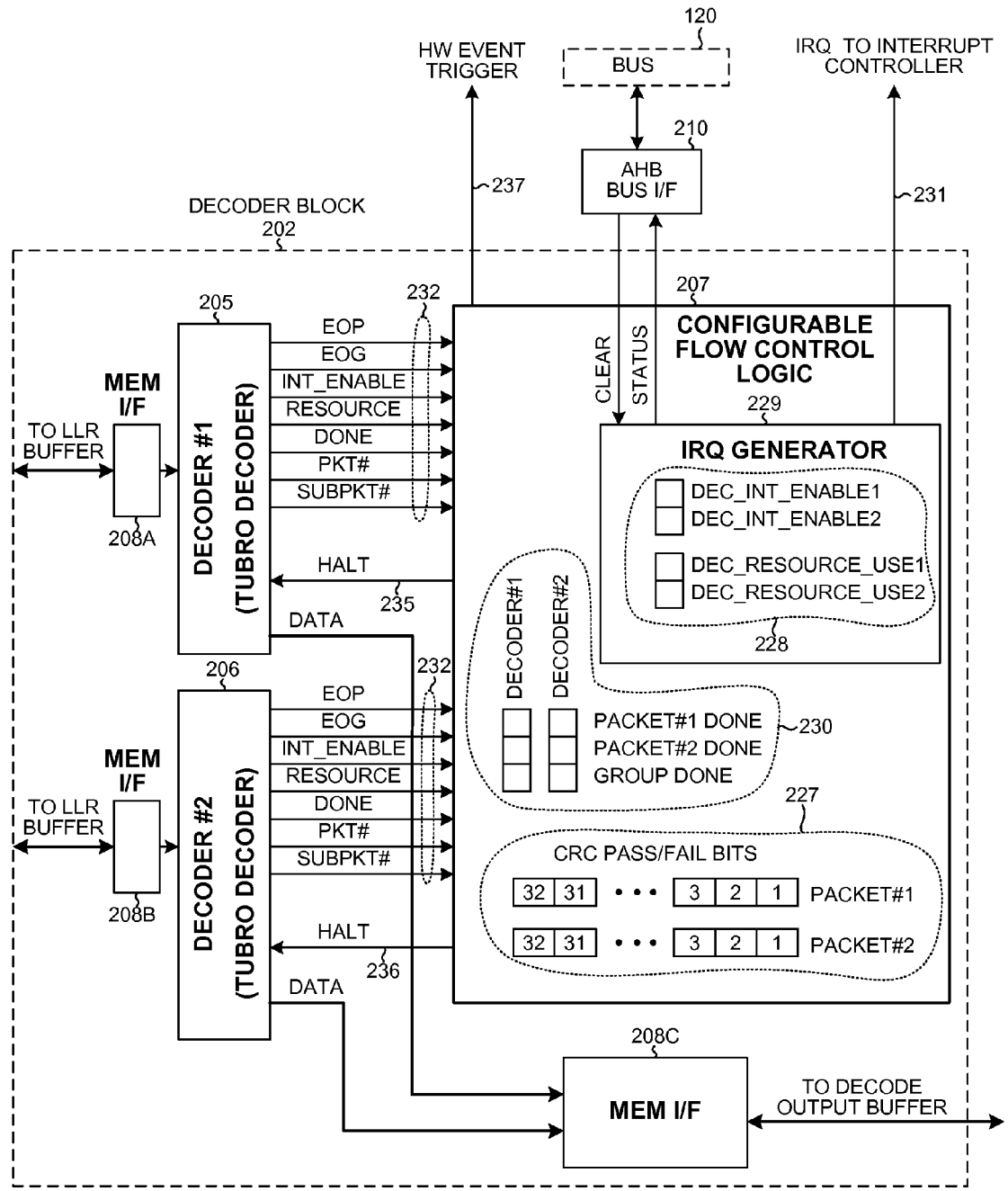
FIG. 7 is a more detailed diagram of the decoder block 202 of the DDE WCSMSC 125 of FIG. 6.

FIG. 7 is a more detailed block diagram of a part of decoder block 202 of FIG. 6. Viterbi decoders 203 and 204 of FIG. 6 are not pictured in FIG. 7. The functionality of memory interface circuitry 208 of FIG. 6 is shown in more detail in FIG. 7 in memory interface circuits 208A, 208B and 208C. To increase the decoding throughput rate of processing of data traffic sub-packets, two turbo decoders 205 and 206 are provided and these two decoders are controlled to operate on sub-packets in parallel. There is a stream of one or more sub-packets that makes up a packet. A broadcast packet, for example, includes a single sub-packet. A DCH packet, for example, can include many sub-packets. There is also a stream of one or more packets that makes up a group of packets. A group can include packets including both a broadcast packet and data packets. Sometimes the term "frame" is used to refer to the plurality of packets rather than the term "group", but in this document the term "group" is used. Sometimes what is referred to here as a "sub-packet" is referred to elsewhere using the term "packet".

Under the control of processing circuit 115 through the issuing of a DDE execute task instruction, an individual one of the sub-packets is processed by a selected one of decoders 205 and 206. Accordingly, there is a sequence of DDE execute task instructions that causes the entire stream of sub-packets of the packet and the group to be decoded. Some sub-packets of a packet can be processed by one decoder, whereas others of the sub-packets of the packet can be processed by the other decoder. Alternatively, all sub-packets of a packet can be decoded by one decoder. The use of a single decoder to decode a packet or the use of two decoders to decode a packet can be changed from packet to packet within the group of packets.

Configurable flow control logic 207 includes one sequential data storage bit for storing CRC (cyclic redundancy check) pass/fail information for each sub-packet of a group of packets being decoded by DDE WCSMSC 125. In the illustrated example of FIG. 7, a group can include at most two packets, and a packet can include at most thirty-two sub-packets. Accordingly, there are sixty-four CRC storage bits 227. If the one of decoders 205 and 206 that decodes a sub-packet determines that there was a CRC fail, then the corresponding one of bits 227 is reset to have a logic state "0", whereas if the determination was that there was a CRC pass then the corresponding bit is set to have a logic state "1".

In addition, configurable flow control logic 207 includes four bits 228 for storing configuration information: a DEC_INT_ENABLE1 bit, a DEC_INT_ENABLE2 bit, a DEC_RESOURCE_USE1 bit, and a DEC_RESOURCE_USE2 bit. If the DEC_RESOURCE_USE1/2 bits are set to have the two-bit value "00", then the decoder block 202 is set to operate in a single decoder mode. Only one of the two decoders processes sub-packets of a packet. If the DEC_RESOURCE_USE1/2 bits are set to have the two-bit value "01", then the decoder block 202 is set to operate in a dual decoder group mode in which sub-packets of the group of sub-packets being processed are processed by a combination of the two decoders 205 and 206. If the DEC_RESOURCE_USE1/2 bits are set to have the two-bit value "10", then the decoder block 202 is set to operate in a dual decoder packet mode in which sub-packets of a packet being processed are processed by a combination of the two decoders 205 and 206. How these bits are set and used is described in further detail below. If the DEC_INT_ENABLE1/2 bits are set to have the two-bit value "00", then an interrupt generator 229 is configured in a first interrupt generation mode not to assert an interrupt signal onto conductor 231. Signal conductor 231 extends to an interrupt controller (not shown), which in turn asserts an interrupt signal to processing circuit 115 of FIG. 5. If the DEC_INT_ENABLE1/2 bits are set to have the two-bit value "01", then interrupt generator 229 is configured into IMMEDIATE interrupt generation mode in which an interrupt is asserted immediately upon decoding of the current sub-packet. If the DEC_INT_ENABLE1/2 bits are set to have the two-bit value "10", then interrupt generator 229 is configured into PACKET interrupt generation mode in which an interrupt is asserted upon completion of decoding of the current packet being processed. If the DEC_INT_ENABLE1/2 bits are set to have the two-bit value "11", then interrupt generator 229 is configured into a GROUP interrupt generation mode in which an interrupt is asserted upon completion of decoding of the current group being processed.

In addition, configurable flow control logic 207 includes six "done" bits 230 of information: a bit that stores an indication that DECODER#1 has completed decoding all its assigned sub-packets of PACKET#1, a bit that stores an indication that DECODER#2 has completed decoding all its assigned sub-packets of PACKET#1, a bit that stores an indication that DECODER#1 has completed decoding all its assigned sub-packets of PACKET#2, a bit that stores an indication that DECODER#2 has completed decoding all its assigned sub-packets of PACKET#2, a bit that stores an indication that DECODER#1 has completed decoding all its assigned sub-packets of a group, and a bit that stores an indication that DECODER#2 has completed decoding all its assigned sub-packets of a group. How these bits are set and used is described in further detail below.

FIG. 8 is a simplified diagram of the DDE execute task instruction that causes DDE WCSMSC 125 to process an individual sub-packet. The first sixty-four bits of the task instruction is a common header that includes an opcode OP. The task manager that reads the task instruction interprets the opcode to determine what kind of task instruction the task instruction is. The common header also includes a length field that indicates the number of words in the task instruction. The task manager reading the task instruction from memory 117 uses this length field to determine how many words to read. Some of the other fields of the DDE execute task instruction pertain particularly to decoder block 202. These fields include a three-bit DEC_LLR_SEG field that indicates which one of eight segments of the LLR buffer holds the LLR values to be decoded. FIG. 9 illustrates eight segments of the LLR buffer. The fields of the DDE execute task instruction that pertain to the decoder block also include an eleven-bit DEC_LLR_SEG_OFFSET field that indicates at offset between the beginning of the indicated segment to the location where the sub-packet data begins. FIG. 9 illustrates this offset. The DDE execute task instruction also includes a sixteen-bit DEC_SUBPKT_SIZE field that indicates the length of the sub-packet as stored in the LLR buffer. FIG. 9 illustrates this size. Together, the DEC_LLR_SEG, DEC_LLR_SEG_OFFSET and DEC_SUBPKT_SIZE fields identify the source sub-packet data to be processed by decoder block 202. The DDE execute task instruction also includes information on where to store results of the decode operation. The sixteen-bit DEC_OB_DEST_ADDR field indicates the starting address in the decode output buffer 130 where the decode outputs are to be written. In addition, the DDE execute task instruction includes a six-bit DEC_SUBPKT_INDEX field that indicates a number (sub-packet index) that identifies the sub-packet to be processed from the other sub-packets of the stream. As indicated above, there may be two packets in the group of packets being processed, so the DDE execute task instruction includes a one-bit DEC_PKT_NUMBER field that identifies whether the packet to which the sub-packet belongs is the first or the second packet of the group. The DDE execute task instruction also includes other fields of bits as indicated above (DEC_RESOURCE_USE and DEC_INT_ENABLE) that specify the configuration that the decoder block should have in processing the identified sub-packet. If the sub-packet to be processed by a particular decoder is the last sub-packet to be assigned to the decoder for the current packet, then the one-bit EOP field (end-of-packet) is set to mark the associated sub-packet. If the sub-packet to be processed by a particular decoder is the last sub-packet to be assigned to the decoder for the current group, then the one-bit EOG field (end-of-group) is set to mark the associated sub-packet. The value in a three-bit DEC_SEL field determines which of the two decoders should process the sub-packet or if neither of the two decoders should process the sub-packet. Processing circuit 115 can set the value in this field to specify which of the decoders should perform decoding on the sub-packet, or whether in a test mode neither of the decoders should be used.

The DEC_GEN_TX_ACK field indicates whether the DDE WCSMSC 125 should assert a hardware event trigger signal onto a point-to-point conductor 237 to transmit channel 114 (see FIG. 5). Processing circuit 115 can, via a task instruction provided to the transmit channel, set up a transmission in the transmit channel 114 where the transmission will either be an acknowledgement (ACK) transmission or will be a negative acknowledgement (NACK) transmission depending on a result of processing by decoder block 202. The processing circuit 115 also causes the flow control logic 207 to assert the hardware event trigger signal onto conductor 237 such that this trigger signal supplies to the transmit channel 114 (see FIG. 5) the result of the decoding operation, thereby determining whether the transmission is an ACK or NACK. The use of a hardware event trigger signal in this fashion reduces latency in returning an ACK/NACK to a transmitting device.

Figure 10:
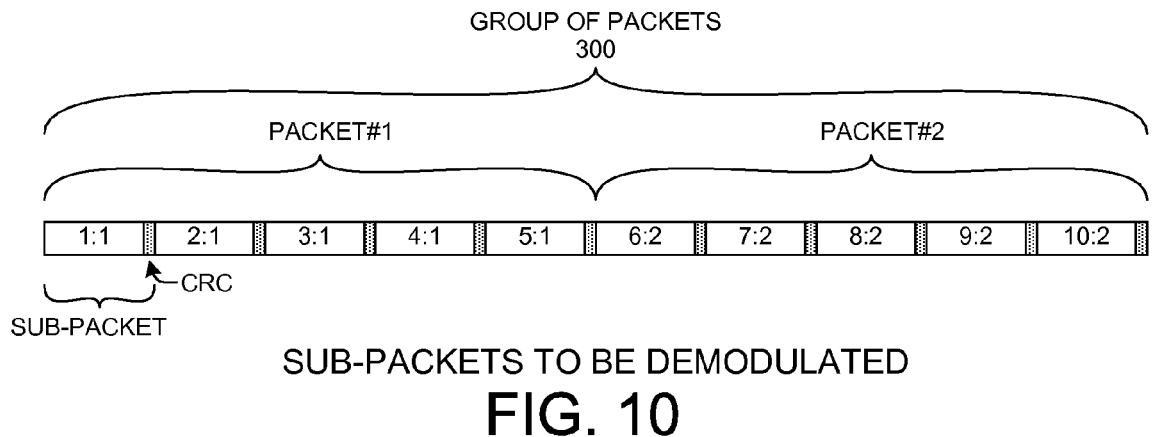
FIG. 10 is a diagram that illustrates a group of packets. Each packet of the group includes a plurality of sub-packets.

FIG. 10 is a diagram of a group 300 of sub-packets to be processed by DDE WCSMSC 125 in an operational example described below. Group 300 includes two packets: PACKET#1 and PACKET#2. Individual sub-packets in the diagram are identified by the notation of the form of a first numeral, followed by a colon, followed by a second numeral. The second numeral indicates the packet number. The first numeral indicates the number of the sub-packet within the packet. Each sub-packet includes a CRC value as illustrated.

Figure 11:
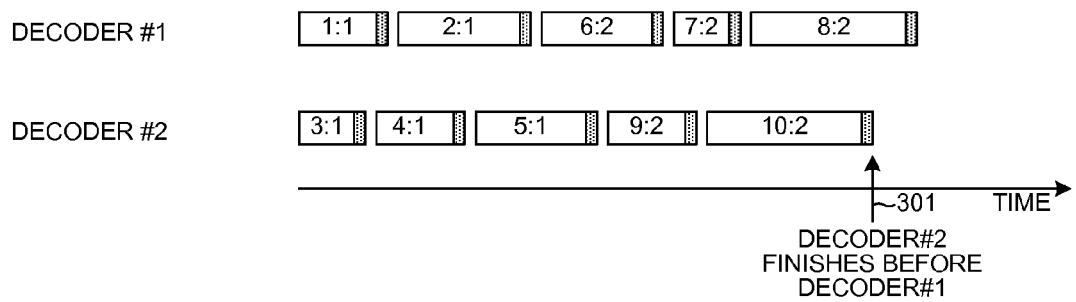
FIG. 11 is a diagram that illustrates a first scenario in which a second decoder DECODER#2 finishes decoding its assigned sub-packets of the group of FIG. 10 before a first decoder DECODER#1 finishes decoding its assigned sub-packets of the group.

FIG. 11 is a diagram that illustrates a first scenario of decoding of the sub-packets of FIG. 10 by decoders 205 and 206. Each sub-packet is assigned to be decoded by a selected one of the two decoders by an associated task instruction. Sub-packets 1:1 and 2:1 of the first packet are to be decoded by DECODER#1 (decoder 205) whereas sub-packets 3:1, 4:1 and 5:1 are to be decoded by DECODER#2. After DECODER#1 has decoded all sub-packets assigned to it for the first packet, then it is to decode sub-packets 6:2, 7:2 and 8:2 of the second packet. After DECODER#2 has decoded all sub-packets assigned to it for the first packet, then it is to decode sub-packets 9:2 and 10:2 of the second packet. In the diagram of FIG. 11, time extends from left to right. The duration of the processing of each sub-packet in the diagram of FIG. 11 is indicated by the length of the block representing the sub-packet. Due to the amounts of time consumed in the decoding of the various sub-packets, DECODER#2 finishes decoding sub-packets of the second packet at the time indicated by arrow 301 before DECODER#1 finishes decoding sub-packets of the second packet.

Figure 12:
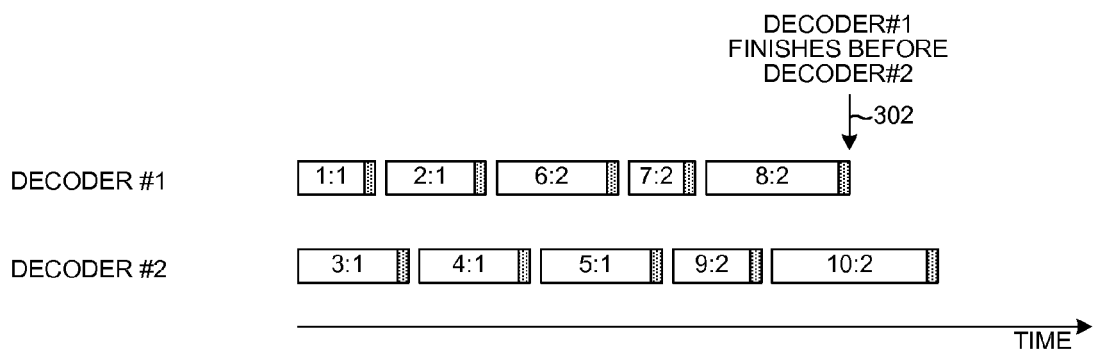
FIG. 12 is a diagram that illustrates a second scenario in which the first decoder DECODER#1 finishes decoding its assigned sub-packets of the group of FIG. 10 before the second decoder DECODER#2 finishes decoding its assigned sub-packets of the group.

FIG. 12 is a diagram that illustrates a second scenario of decoding of the sub-packets of FIG. 10 by decoders 205 and 206. In the scenario of FIG. 12, due to the amounts of time consumed in the decoding of the various sub-packets, DECODER#1 finishes decoding sub-packets of the second packet at the time indicated by arrow 302 before DECODER#2 finishes decoding sub-packets of the second packet. Regardless of which scenario occurs, it is desired that only one interrupt indicating that processing has been completed be sent to processing circuit 115. Depending on how the DDE WCSMSC 125 is configured by processing circuit 115, it may be desired that an additional interrupt be sent to processing circuit 115 after all sub-packets of the first packet have been processed. Novel DDE WCSMSC 125 is configurable to perform these functions as set forth below.

Figure 13:
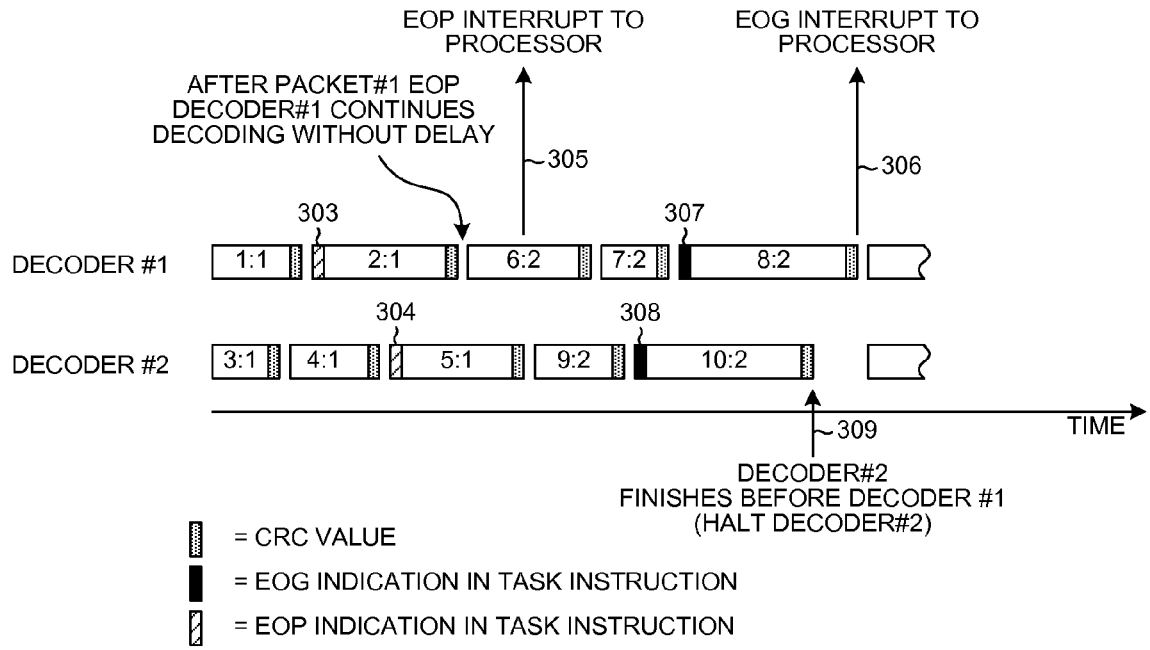
FIG. 13 is a diagram that illustrates how novel EOP and EOG markers are used in task instructions to generate an end-of-packet interrupt signal to the processing circuit 115 of FIG. 5 without halting either of the two cooperating decoders, without generating two EOP interrupts at the end of the first packet, and without generating two EOG interrupts at the end of the group. At the end-of-group, a single EOG interrupt is generated, but the first decoder to finish processing its assigned sub-packets of the group is halted.

FIG. 13 is a diagram that illustrates how the novel DDE WCSMSC 125 operates to generate one and only one interrupt upon completion of decoding of the last sub-packet of the first packet, and how the DDE WCSMSC 125 also operates to generate one and only one interrupt upon completion of decoding of the last sub-packet of the group. In one novel aspect, processing circuit 115 marks the last sub-packet of a packet being assigned for decoding to a decoder. For example, the last sub-packet of the first packet to be assigned for decoding to DECODER#1 is sub-packet 2:1. This sub-packet 2:1 is therefore marked as being the last sub-packet of the first packet by setting the EOP bit in the DDE execute task instruction for sub-packet 2:1. This marking is schematically indicated in FIG. 13 by the cross-hatched mark 303. Similarly, the last sub-packet of the first packet to be assigned for decoding to DECODER#2 is sub-packet 5:1. This sub-packet is therefore marked as being the last sub-packet of the first packet by setting the EOP bit in the DDE execute task instruction for sub-packet 5:1. This marking is schematically indicated in FIG. 13 by the cross-hatched mark 304.

When one of the decoders completes decoding a sub-packet marked with an EOP marker being set, then that decoder generates a packet done indication by setting which ever one of its PACKET#1 DONE and PACKET#2 DONE bits is appropriate as determined by the DEC_PKT_NUMBER of the sub-packet just decoded. The PACKET#1 DONE and PACKET#2 DONE bits are located in flow control logic 207. When both of the PACKET#1 DONE and PACKET#2 DONE bits in flow control logic 207 are detected to have been set, then interrupt generator 229 asserts an interrupt signal on interrupt conductor 231. This is indicated in FIG. 13 by arrow 305. As a decoder completes decoding each sub-packet, the decoder causes the corresponding bit in the CRC pass/fail bits 227 to be set or reset depending on whether the CRC check performed on the sub-packet passed or failed. The packet number of the pass/fail bit is given by the DEC_PKT_NUMBER value of the sub-packet being decoded. The sub-packet number of the pass/fail bit is given by the DEC_SUBPKT_INDEX value of the sub-packet being decoded. These DEC_PKT_NUMBER (PKT#) and DEC_SUBPKT_INDEX (SUBPKT#) values are supplied by conductors 232 from the decoder doing the decoding to flow control logic 207 of FIG. 7.

When the interrupt signal on conductor 231 is asserted, the interrupt signal is supplied to an input lead of the interrupt controller (not shown). The interrupt controller in turn asserts an interrupt signal that is supplied to processing circuit 115. This interrupt indicates that all sub-packets of the first packet have been decoded. As a result of the asserting of the interrupt signal, processing circuit 115 is interrupted and jumps to an interrupt service routine. In executing the interrupt service routine, processing circuit 115 performs various reads to determine what caused the interrupt. Processing circuit 115 reads the CRC bits 227 and other status information collected by flow control logic 207 via AHB bus interface 210 and second bus 120. The status information indicates what condition caused interrupt generator 229 to assert the interrupt signal. The reading of the CRC value and the status information by processing circuit 115 causes interrupt generator 229 to be reset such that the interrupt signal on conductor 231 is no longer asserted. The clearing of the interrupt is indicated in FIG. 7 by the signal labeled CLEAR. The reading back of the CRC bit values and status information is indicated in FIG. 7 by the signals labeled STATUS. Once the interrupt signal on conductor 231 has been returned to its unasserted state, the interrupt signal can again be asserted to indicate another condition.

Returning to FIG. 13, the DDE WCSMSC 125 is configured to assert an interrupt at the end of decoding of the group. One and only one interrupt is to be generated at this time 306. In one novel aspect, processing circuit 115 marks the last sub-packet of the group being assigned for decoding to each decoder. For example, the last sub-packet of the group to be assigned for decoding to DECODER#1 is sub-packet 8:2. Sub-packet 8:2 is therefore marked as being the last sub-packet of the group by setting the EOG bit in the DDE execute task instruction for sub-packet 8:2. This marking is indicated in FIG. 13 by the solid black mark 307. The last sub-packet of the group to be assigned for decoding to DECODER#2 is sub-packet 10:2. Sub-packet 10:2 is therefore marked as being the last sub-packet of the group by setting the EOG bit in the DDE execute task instruction for sub-packet 10:2. This marking is indicated in FIG. 13 by the solid black mark 308. When one of the decoders completes decoding a sub-packet marked with an EOG bit being set, then that decoder generates a group done indication by setting its GROUP DONE bit. When both of the GROUP DONE bits are set, then interrupt generator 229 asserts the interrupt signal on interrupt conductor 231. This is indicated in FIG. 13 by arrow 306. As in the case of the interrupt generated by the EOP condition at time 305, the processing circuit 115 is interrupted. The processing circuit 115 responds by executing an interrupt service routine, execution of which causes processing circuit 115 to read the CRC values and other status information from flow control logic 207. The status information read indicates that the interrupt signal was asserted due to an end-of-group (EOG) condition. The reading of the CRC values and status information causes the interrupt signal to return to its unasserted state so that it can be asserted again to signal the occurrence of another condition. Note that in the example of FIG. 13, the EOP interrupt signal asserting occurs only once, even though multiple decoders are used in processing sub-packets of the first packet. Note also that in the example of FIG. 13, the EOG interrupt signal asserting occurs only once, even though multiple decoders are used in the decoding the last packet of the group. None of the multiple decoders is halted after completing the decoding of sub-packets for the first packet, but rather all decoders continue on decoding sub-packets as instructed by task instructions. In the embodiment of FIG. 7 when a decoder completes decoding the last sub-packet assigned to it for the group as indicated by the EOG mark, then flow control logic 207 asserts a halt signal that is sent back to the decoder to halt operation of that decoder. In FIG. 7, these halt signals are communicated across conductors 235 and 236. Accordingly, in the scenario of FIG. 13, the second DECODER#2 that completes processing first is halted at time 309. The halt condition is removed upon clearing of the interrupt by processing circuit 115.

Figure 14:
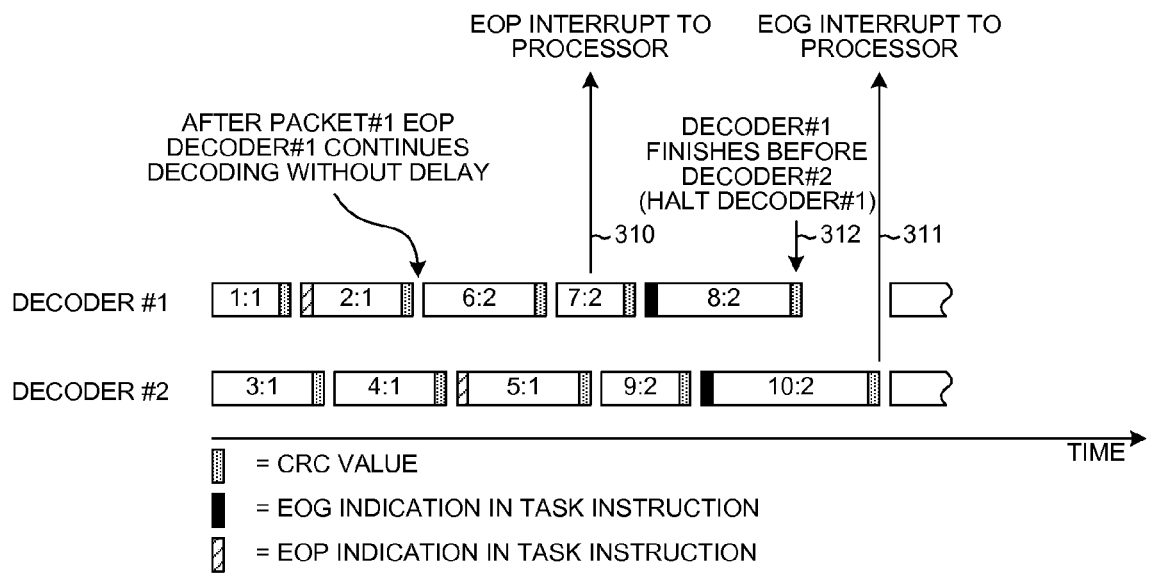
FIG. 14 is a diagram that illustrates how the novel EOP and EOG markers and task instructions are used to generate the desired EOP and EOG interrupts in the second scenario in which the first decoder DECODER#1 finishes first.

FIG. 14 is a diagram that illustrates how the novel DDE WCSMSC 125 operates in the second scenario in which DECODER#1 finishes decoding sub-packets of the group before DECODER#2. When DECODER#1 completes decoding sub-packet 2:1 it causes the PACKET#1 DONE bit for DECODER#1 to be set in the flow control logic 207. This is accomplished by sending appropriate status signals across conductors 232. Appropriate status signals include a DONE signal, a packet index PKT#, and an end-of-packet (EOP) signal. Even though DECODER#1 has completed decoding all sub-packets assigned to it for the first packet, and even though more sub-packets of the first packet remain to be decoded by the other decoder DECODER#2, DECODER#1 nevertheless continues decoding sub-packets without delay. DECODER#1 immediately begins decoding sub-packet 6:2. The PACKET#2 DONE bit for DECODER#2 is not set at this point because DECODER#2 is still decoding sub-packets of the first packet. When DECODER#2 finishes decoding the last sub-packet assigned to it for the first packet (sub-packet 5:1), then DECODER#2 generates a packet done indication by setting the PACKET#1 DONE bit for DECODER#2 in flow control logic 207. Because both PACKET DONE bits are set, the interrupt controller 229 asserts the interrupt signal on conductor 231 at time 310. Similarly, the interrupt signal is only asserted once at time 311 in response to both decoders having completed decoding all their assigned sub-packets for the group. The first decoder DECODER#1 completed decoding its last assigned sub-packet of the group at time 312. Flow control logic 207 is aware of this condition due to the first decoder supplying the flow control logic 207 a group done indication. Flow control logic 207 responds by asserting a halt signal that is supplied back to DECODER#1 on conductor 235, thereby halting DECODER#1. Once processing circuit 115 has read the CRC information and other status information in response to the EOG interrupt, then the halt condition is removed.

Figure 15:
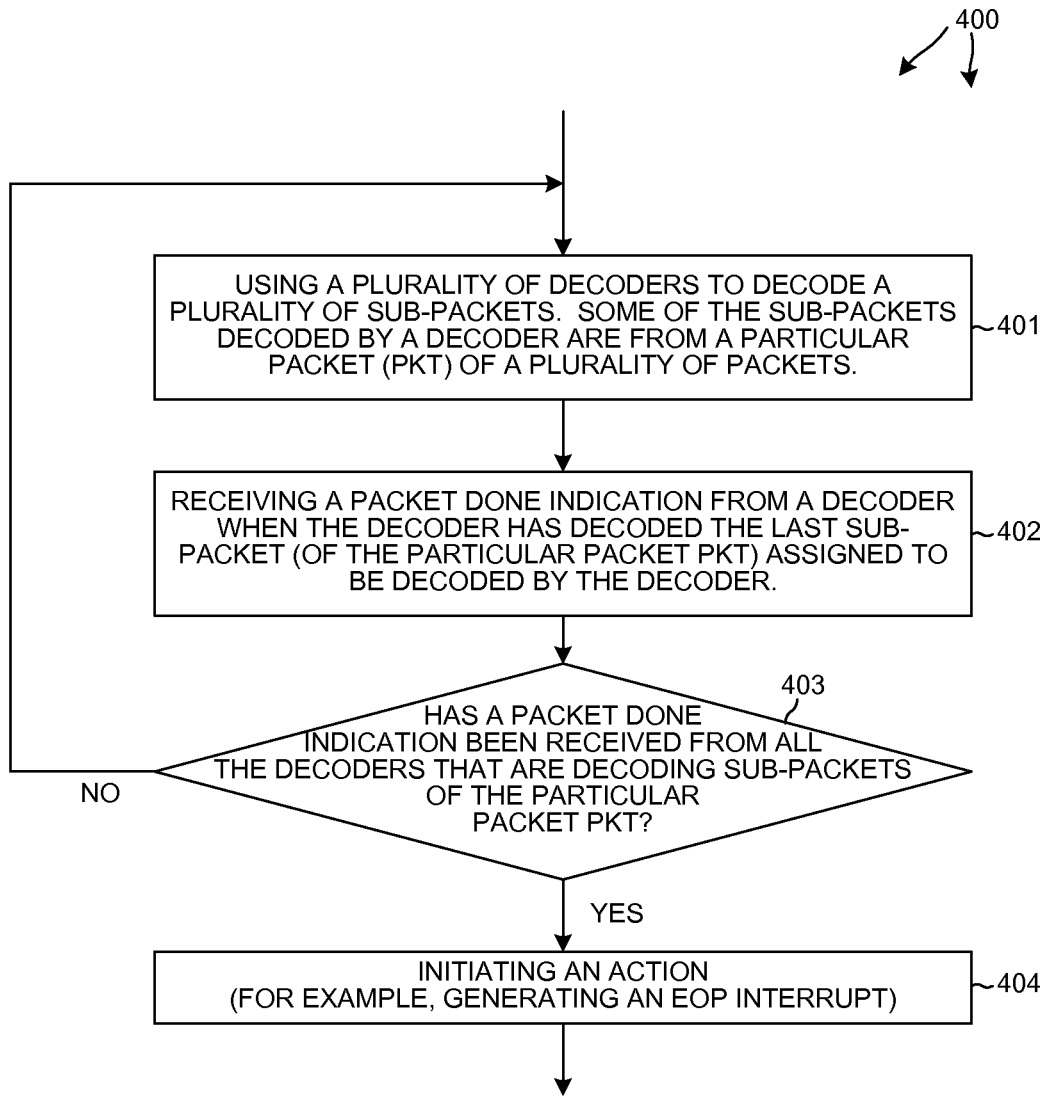
FIG. 15 is a simplified flowchart of a method in accordance with one novel aspect.

FIG. 15 is a flowchart of a method 400 in which a plurality of decoders work together (step 401) to decode various sub-packets of a packet. Some of the sub-packets decoded by a particular decoder are from a particular packet (designated here as "PKT") of the plurality of packets. The particular packet PKT can be any packet in a group of packets. For example, as shown in FIG. 13, sub-packets 1:1 and 2:1 of a first packet (the "PKT" packet) are decoded by a first decoder, whereas sub-packets 3:1, 4:1 and 5:1 of the first packet are decoded by a second decoder. A packet done indication is received (step 402) from a decoder when that decoder has decoded the last sub-packet of the packet PKT that the decoder was assigned to decode. For example, as shown in FIG. 13, the first decoder was assigned to decode sub-packets 1:1 and 2:1 of the first packet (the "PKT" packet), and when the first decoder completes decoding sub-packet 2:1 (which is the last sub-packet of the first packet that the first decoder is to decode), then the first decoder generates a first packet done indication. This first packet done indication is received by the flow control logic 207 of FIG. 7 and results in the PACKET#1 DONE bit for the first decoder being set. Similarly, the second decoder was assigned to decode sub-packets 3:1, 4:1 and 5:1 of the first packet. When the second decoder completed decoding sub-packet 5:1 (which is the last sub-packet of the first packet that the second decoder is to decode), then the second decoder generates a second packet done indication. This second packet done indication is received by the flow control logic 207 of FIG. 7 and results in the PACKET#1 DONE bit for the second decoder being set. If a packet done indication has been received from all the decoders that are decoding sub-packets of the particular packet PKT (step 403), then an action is initiated (step 404). In one example, the action initiated is the assertion of an interrupt signal onto conductor 231 by flow control logic 207. The processing circuit 115 may then respond by reading information from flow control logic 207, thereby resetting the interrupt signal.

The techniques described herein may be implemented by various means. In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of the various features of the described specific embodiments can be practiced without departing from the scope of the claims that are set forth below.

What is claimed is:

1. A circuit comprising:
   a plurality of decoders, wherein each decoder can be assigned tasks of decoding a sequence of one or more sub-packets of a group of packets, wherein said each decoder generates a packet done indication if the decoder has completed all the assigned tasks of decoding all the sub-packets of a packet; and
   a control circuit that receives the packet done indication from each of the plurality of decoders and based at least in part on the packet done indications asserts an interrupt signal, wherein the interrupt signal is not asserted during a time that any decoder is decoding a sub-packet of the packet but rather is asserted only after a packet done indication has been received from every decoder that decoded any sub-packet of the packet, wherein the packet done indication includes a done signal and an end-of-packet signal, wherein the done signal and the end-of-packet signal are present on at least one conductor extending from a decoder and into the control circuit.

2. The circuit of claim 1, wherein the done signal is present on a first conductor extending from a decoder and into the control circuit, and wherein the end-of-packet signal is present on a second conductor extending from the decoder and into the control circuit.

3. The circuit of claim 1, wherein said each decoder supplies a group done indication if the decoder has completed all the assigned tasks of decoding all sub-packets of the group of packets, wherein the control circuit receives a group done indication from each of the plurality of decoders.

4. The circuit of claim 1, wherein the control circuit generates a plurality of halt signals, wherein one of the plurality of halt signals is supplied to a corresponding respective one of the plurality of decoders.

5. The circuit of claim 4, wherein the control circuit uses the halt signals to halt individual ones of the decoders as they complete decoding all their assigned tasks of decoding sub-packets of the group.

6. The circuit of claim 1, wherein the control circuit is configurable to assert the interrupt signal in response to packet done indications having been received from every decoder that decoded a sub-packet of the packet, and wherein the control circuit is also configurable such that the control circuit does not assert the interrupt signal in response to receiving a packet done indication.

7. The circuit of claim 1, wherein the interrupt signal is an end-of-packet (EOP) interrupt signal, and wherein the control circuit is also configurable such that the control circuit does not assert the EOP interrupt signal.

8. The circuit of claim 1, wherein the circuit is operable such that one of the decoders decodes a sequence of sub-packets of a first packet and supplies a packet done indication to the control circuit and then begins decoding a sequence of sub-packets of a second packet without being halted, wherein the first and second packets are packets of the group, and wherein the control circuit does not assert the interrupt signal at the time the control circuit receives the packet done indication from said one decoder but rather asserts the interrupt signal once after packet done indications have been received from every decoder that decoded any sub-packet of the packet.

9. The circuit of claim 1, wherein the packet done indication supplied by a decoder is received by the control circuit along with a sub-packet index, wherein the sub-packet index identifies a last sub-packet of the packet that the decoder decoded.

10. The circuit of claim 1, wherein the packet done indication supplied by a decoder is received by the control circuit along with a packet index, wherein the packet index identifies the packet to which the packet done indication pertains.

11. The circuit of claim 1, further comprising:
a processor that can assign one of the plurality of decoders a task of decoding a sub-packet by generating a task instruction, wherein the task instruction includes information indicating where the sub-packet is located in a buffer.

12. The circuit of claim 1, further comprising:
a processor that can assign one of the plurality of decoders a task of decoding a sub-packet by generating a task instruction, wherein the task instruction includes an indication of whether the sub-packet is the last sub-packet of a sequence of sub-packets of a packet, wherein the sequence of sub-packets is to be decoded by said one decoder.

13. The circuit of claim 1, further comprising:
a processor that can assign one of the plurality of decoders a task of decoding a sub-packet by generating a task instruction, wherein the task instruction includes an indication of whether the sub-packet is a last sub-packet of a sequence of sub-packets of a group of packets, wherein the sequence of sub-packets is to be decoded by said one decoder.

14. The circuit of claim 1, wherein one of the decoders decodes a sub-packet in response to a task instruction, wherein the task instruction identifies the sub-packet and includes a field containing an end-of-packet bit, and wherein the decoder asserts its packet done indication upon completion of decoding the sub-packet if the end-of-packet bit has a predetermined binary value.

15. The circuit of claim 1 wherein the control circuit controls the plurality of decoders to decode respective sub-packets at least partially in parallel.

16. A circuit comprising:
a first turbo decoder adapted to decode a sequence of first sub-packets without halting until a last one of the first sub-packets has been decoded, wherein some of first sub-packets are of a first packet and others of the first sub-packets are of a second packet;
a second turbo decoder adapted to decode a sequence of second sub-packets without halting until a last one of the second sub-packets has been decoded, wherein some of the second sub-packets are of the first packet and others of the second sub-packets are of the second packet;
a processing circuit; and
a control circuit that is configurable to alert the processing circuit when all sub-packets of the first packet have been decoded.

17. The circuit of claim 16, wherein the first sub-packets are sub-packets of a group of packets, wherein the second sub-packets are sub-packets of the same group of packets, wherein the first turbo decoder halts decoding sub-packets if it completes decoding of all the first sub-packets of the group before the second turbo decoder completes decoding of all the second sub-packets of the group, and wherein the second turbo decoder halts decoding sub-packets if it completes decoding of all the second sub-packets of the group before the first turbo decoder completes decoding of all the first sub-packets of the group.

18. The circuit of claim 16 wherein the control circuit that is configurable to control the first turbo decoder and the second turbo decoder to decode respective first sub-packets and second sub-packets at least partially in parallel.

19. A method comprising:
using a plurality of decoders to decode a plurality of sub-packets of a group of packets, wherein some of the sub-packets are of a first packet, wherein others of the sub-packets are of a second packet, wherein the group of packets includes the first and second packets;
maintaining an interrupt signal in an unasserted state throughout a time when sub-packets of the first packet are being decoded by the plurality of decoders; and
asserting the interrupt signal when all the sub-packets of the first packet have been decoded.

20. The method of claim 19, wherein a first decoder of the plurality of decoders decodes sub-packets of the first packet and then decodes sub-packets of the second packet without halting, and wherein a second decoder of the plurality of decoders decodes sub-packets of the first packet and then decodes sub-packets of the second packet without halting.

21. The method of claim 19, wherein some of the sub-packets of the first packet are decoded by a first decoder of the plurality of decoders, and wherein others of the sub-packets of the first packet are decoded by a second decoder of the plurality of decoders.

22. The method of claim 19, further comprising:
receiving a packet done indication from each of the plurality of decoders and using the packet done indications received from the plurality of decoders to determine when to assert the interrupt signal.

23. The method of claim 19, further comprising:
halting any decoder of the plurality of decoders that completes decoding sub-packets of the group before another decoder of the plurality of decoders has completed decoding sub-packets of the group.

24. The method of claim 19 further comprising operating the plurality of decoders at least partially in parallel.

25. A method comprising:
receiving a first task instruction, wherein the first task instruction includes identification information that identifies a first sub-packet, and wherein the first task instruction further includes a first marker;
decoding the first sub-packet indicated by the identification information in the first task instruction and upon completion of the decoding of the first sub-packet, setting a first bit in a control circuit if the first marker was set;
receiving a second task instruction, wherein the second task instruction includes identification information that identifies a second sub-packet, and wherein the second task instruction further includes a second marker, wherein the first and second sub-packets are sub-packets of a packet;
decoding the second sub-packet indicated by the identification information in the second task instruction and upon completion of the decoding of the second sub-packet, setting a second bit in the control circuit if the second marker was set; and
using the first marker and the second marker in the control circuit to initiate an action.

26. The method of claim 25, wherein the action initiated is an assertion of an interrupt signal output from the control circuit.

27. The method of claim 25, wherein the action initiated is a sending of an acknowledgement (ACK) transmission.

28. The method of claim 25, wherein the first marker of the first task instruction is an end-of-packet (EOP) marker bit.

29. The method of claim 25, wherein the first marker of the first task instruction is an end-of-group (EOG) marker bit, and wherein the packet is one packet of a plurality of packets of a group.

30. The method of claim 25 wherein the decoding the first sub-packet and the decoding the second packet are performed at least partially in parallel.

31. A circuit comprising:
a first turbo decoder adapted to decode a sequence of first sub-packets, wherein some of first sub-packets are of a first packet and others of the first sub-packets are of a second packet;
a second turbo decoder adapted to decode a sequence of second sub-packets, wherein some of the second sub-packets are of the first packet and others of the second sub-packets are of the second packet; and
a control circuit that receives a packet done indication from the first turbo decoder and a packet done indication from the second turbo decoder, wherein the control circuit maintains a packet done interrupt signal in an unasserted state throughout a time when sub-packets of the first packet are being decoded by the first and second turbo decoders, and asserts the packet done interrupt signal when all the sub-packets of the first packet have been decoded.

32. The circuit of claim 31, wherein the circuit is configurable into a selectable one of a plurality of modes, and wherein in one mode the means is configured not to assert a packet done interrupt signal.

33. The circuit of claim 31, wherein the circuit is configurable into a selectable one of a plurality of modes, wherein in one mode the means does not assert a group done interrupt signal, and wherein in another mode the means does assert the group done interrupt signal.

34. The circuit of claim 31, wherein all sub-packets of a third packet can be decoded by the first turbo decoder such that no sub-packets of the third packet are decoded by the second turbo decoder.

35. The circuit of claim 31, wherein the control circuit stores a Cyclic Redundancy Check (CRC) pass/fail bit for each sub-packet of the first packet, and for each sub-packet of the second packet.

36. The circuit of claim 31 wherein the control circuit controls the first turbo decoder and the second turbo decoder to decode respective first sub-packets and second sub-packets at least partially in parallel.

37. A non-transitory computer readable medium storing a computer program product, comprising:
code for causing a computer to control a first decoder such that the first decoder decodes a sequence of first sub-packets, wherein some of first sub-packets are of a first packet and others of the first sub-packets are of a second packet, and for controlling the first decoder such that the first decoder generates a first packet done indication upon the first decoder completing decoding all the first sub-packets of the first packet;
code for causing the computer to control a second decoder such that the second decoder decodes a sequence of second sub-packets, wherein some of second sub-packets are of a first packet and others of the second sub-packets are of a second packet, and for controlling the second decoder such that the second decoder generates a second packet done indication upon the second decoder completing decoding all the second sub-packets of the first packet; and
code for causing the computer to control a control circuit such that the control circuit uses the first and second packet done indications to generate a packet done indication, wherein the packet done indication is not generated during a time that either the first or the second decoder is decoding a sub-packet of the packet but rather is generated only after both the first packet done indication has been received from the first decoder and the second packet done indication has been received from the second decoder.

38. The computer program product of claim 37, wherein the first decoder decodes the first sub-packets of the first packet and the first sub-packets of the second packet without halting, and wherein the second decoder decodes the second sub-packets of the first packet and the second sub-packets of the second packet without halting.

39. The computer program product of claim 37, wherein the non-transitory computer-readable medium further comprises code for causing the computer to control a control circuit such that the control circuit causes the first decoder and the second decoder to decode the respective sequence of first sub-packets and sequence of second sub-packets at least partially in parallel.

40. A method comprising:
assigning tasks of decoding to a plurality of decoders, wherein each decoder can be assigned tasks of decoding a sequence of one or more sub-packets of a group of packets, wherein said each decoder generates a packet done indication if the decoder has completed all the assigned tasks of decoding all the sub-packets of a packet; and
receiving the packet done indication from each of the plurality of decoders; and
asserting an interrupt signal based at least in part on the packet done indications, wherein the interrupt signal is not asserted during a time that any decoder is decoding a sub-packet of the packet but rather is asserted only after a packet done indication has been received from every decoder that decoded any sub-packet of the packet, wherein the packet done indication includes a done signal and an end-of-packet signal, wherein the done signal and the end-of-packet signal are present on at least one conductor extending from a decoder.

41. An apparatus comprising:
means for assigning tasks of decoding to a plurality of decoders, wherein each decoder can be assigned a sequence of one or more sub-packets of a group of packets, wherein said each decoder generates a packet done indication if the decoder has completed all the assigned tasks of decoding all the sub-packets of a packet;
means for receiving the packet done indication from each of the plurality of decoders; and
means for asserting an interrupt signal based at least in part on the packet done indications, wherein the interrupt signal is not asserted during a time that any decoder is decoding a sub-packet of the packet but rather is asserted only after a packet done indication has been received from every decoder that decoded any sub-packet of the packet, wherein the packet done indication includes a done signal and an end-of-packet signal, wherein the done signal and the end-of-packet signal are present on at least one conductor extending from a decoder.

42. A non-transitory computer readable medium storing a computer program product, comprising:
code for causing a computer to assign tasks of decoding to a plurality of decoders, wherein each decoder can be assigned a sequence of one or more sub-packets of a group of packets, wherein said each decoder generates a packet done indication if the decoder has completed all the assigned tasks of decoding all the sub-packets of a packet; and
code for causing a computer to receive the packet done indication from each of the plurality of decoders; and
code for causing a computer to assert an interrupt signal based at least in part on the packet done indications, wherein the interrupt signal is not asserted during a time that any decoder is decoding a sub-packet of the packet but rather is asserted only after a packet done indication has been received from every decoder that decoded any sub-packet of the packet, wherein the packet done indication includes a done signal and an end-of-packet signal, wherein the done signal and the end-of-packet signal are present on at least one conductor extending from a decoder.

43. A method comprising:
decoding a sequence of first sub-packets without halting until a last one of the first sub-packets has been decoded, wherein some of first sub-packets are of a first packet and others of the first sub-packets are of a second packet;
decoding a sequence of second sub-packets without halting until a last one of the second sub-packets has been decoded, wherein some of the second sub-packets are of the first packet and others of the second sub-packets are of the second packet; and
alerting a processing circuit when all sub-packets of the first packet have been decoded.

44. An apparatus comprising:
means for decoding a sequence of first sub-packets without halting until a last one of the first sub-packets has been decoded, wherein some of first sub-packets are of a first packet and others of the first sub-packets are of a second packet;
means for decoding a sequence of second sub-packets without halting until a last one of the second sub-packets has been decoded, wherein some of the second sub-packets are of the first packet and others of the second sub-packets are of the second packet; and
means for alerting a processing circuit when all sub-packets of the first packet have been decoded.

45. A non-transitory computer readable medium storing a computer program product, comprising:
code for causing a computer to decode a sequence of first sub-packets without halting until a last one of the first sub-packets has been decoded, wherein some of first sub-packets are of a first packet and others of the first sub-packets are of a second packet;
code for causing a computer to decode a sequence of second sub-packets without halting until a last one of the second sub-packets has been decoded, wherein some of the second sub-packets are of the first packet and others of the second sub-packets are of the second packet; and
code for causing a computer to alert a processing circuit when all sub-packets of the first packet have been decoded.

46. A circuit comprising:
a plurality of decoders to decode a plurality of sub-packets of a group of packets, wherein some of the sub-packets are of a first packet, wherein others of the sub-packets are of a second packet, wherein the group of packets includes the first and second packets;
a control circuit configured to maintain an interrupt signal in an unasserted state throughout a time when sub-packets of the first packet are being decoded by the plurality of decoders, and to assert the interrupt signal when all the sub-packets of the first packet have been decoded.

47. An apparatus comprising:
means for using a plurality of decoders to decode a plurality of sub-packets of a group of packets, wherein some of the sub-packets are of a first packet, wherein others of the sub-packets are of a second packet, wherein the group of packets includes the first and second packets;
means for maintaining an interrupt signal in an unasserted state throughout a time when sub-packets of the first packet are being decoded by the plurality of decoders; and
means for asserting the interrupt signal when all the sub-packets of the first packet have been decoded.

48. A non-transitory computer readable medium storing a computer program product, comprising:
- code for causing a computer to use a plurality of decoders to decode a plurality of sub-packets of a group of packets, wherein some of the sub-packets are of a first packet, wherein others of the sub-packets are of a second packet, wherein the group of packets includes the first and second packets;
- code for causing a computer to maintain an interrupt signal in an unasserted state throughout a time when sub-packets of the first packet are being decoded by the plurality of decoders; and
- code for causing a computer to assert the interrupt signal when all the sub-packets of the first packet have been decoded.

49. A circuit comprising:
a control circuit configured to receive a first task instruction, wherein the first task instruction includes identification information that identifies a first sub-packet, and wherein the first task instruction further includes a first marker; receive a second task instruction, wherein the second task instruction includes identification information that identifies a second sub-packet, and wherein the second task instruction further includes a second marker, wherein the first and second sub-packets are sub-packets of a packet; and use the first marker and the second marker in the control circuit to initiate an action;
a first decoder to decode the first sub-packet indicated by the identification information in the first task instruction and upon completion of the decoding of the first sub-packet, set a first bit in the control circuit if the first marker was set; and
a second decoder to decode the second sub-packet indicated by the identification information in the second task instruction and upon completion of the decoding of the second sub-packet, set a second bit in the control circuit if the second marker was set.

50. An apparatus comprising:
means for receiving a first task instruction, wherein the first task instruction includes identification information that identifies a first sub-packet, and wherein the first task instruction further includes a first marker;
means for decoding the first sub-packet indicated by the identification information in the first task instruction and upon completion of the decoding of the first sub-packet, setting a first bit in a control circuit if the first marker was set;
means for receiving a second task instruction, wherein the second task instruction includes identification information that identifies a second sub-packet, and wherein the second task instruction further includes a second marker, wherein the first and second sub-packets are sub-packets of a packet;
means for decoding the second sub-packet indicated by the identification information in the second task instruction and upon completion of the decoding of the second sub-packet, setting a second bit in the control circuit if the second marker was set; and
means for using the first marker and the second marker in the control circuit to initiate an action.

51. A non-transitory computer readable medium storing a computer program product, comprising:
- code for causing a computer to receive a first task instruction, wherein the first task instruction includes identification information that identifies a first sub-packet, and wherein the first task instruction further includes a first marker;
- code for causing a computer to decode the first sub-packet indicated by the identification information in the first task instruction and upon completion of the decoding of the first sub-packet, setting a first bit in a control circuit if the first marker was set;
- code for causing a computer to receive a second task instruction, wherein the second task instruction includes identification information that identifies a second sub-packet, and wherein the second task instruction further includes a second marker, wherein the first and second sub-packets are sub-packets of a packet;
- code for causing a computer to decode the second sub-packet indicated by the identification information in the second task instruction and upon completion of the decoding of the second sub-packet, setting a second bit in the control circuit if the second marker was set; and
- code for causing a computer to use the first marker and the second marker in the control circuit to initiate an action.

52. A method comprising:
decoding a sequence of first sub-packets, wherein some of first sub-packets are of a first packet and others of the first sub-packets are of a second packet;
decoding a sequence of second sub-packets, wherein some of the second sub-packets are of the first packet and others of the second sub-packets are of the second packet;
receiving a packet done indication when the decoding a sequence of first sub-packets is complete;
receiving a packet done indication when the decoding a sequence of second sub-packets is complete,
maintaining a packet done interrupt signal in an unasserted state throughout a time when sub-packets of the first packet are being decoded; and
asserting the packet done interrupt signal when all the sub-packets of the first packet have been decoded.

53. An apparatus comprising:
means for decoding a sequence of first sub-packets, wherein some of first sub-packets are of a first packet and others of the first sub-packets are of a second packet;
means for decoding a sequence of second sub-packets, wherein some of the second sub-packets are of the first packet and others of the second sub-packets are of the second packet; and
means for receiving a packet done indication when the decoding a sequence of first sub-packets is complete;
means for receiving a packet done indication when the decoding a sequence of second sub-packets is complete,
means for maintaining a packet done interrupt signal in an unasserted state throughout a time when sub-packets of the first packet are being decoded; and
means for asserting the packet done interrupt signal when all the sub-packets of the first packet have been decoded.

54. A non-transitory computer readable medium storing a computer program product, comprising:
- code for causing a computer to decode a sequence of first sub-packets, wherein some of first sub-packets are of a first packet and others of the first sub-packets are of a second packet;
- code for causing a computer to decode a sequence of second sub-packets, wherein some of the second sub-packets are of the first packet and others of the second sub-packets are of the second packet;

code for causing a computer to receive a packet done indication when the decoding a sequence of first sub-packets is complete;

code for causing a computer to receive a packet done indication when the decoding a sequence of second sub-packets is complete, code for causing a computer to maintain a packet done interrupt signal in an unasserted state throughout a time when sub-packets of the first packet are being decoded; and code for causing a computer to assert the packet done interrupt signal when all the sub-packets of the first packet have been decoded.

55. A method comprising:

controlling a first decoder such that the first decoder decodes a sequence of first sub-packets, wherein some of first sub-packets are of a first packet and others of the first sub-packets are of a second packet, and generates a first packet done indication upon the first decoder completing decoding all the first sub-packets of the first packet;

controlling a second decoder such that the second decoder decodes a sequence of second sub-packets, wherein some of second sub-packets are of a first packet and others of the second sub-packets are of a second packet, and generates a second packet done indication upon the second decoder completing decoding all the second sub-packets of the first packet; and controlling a control circuit such that the control circuit uses the first and second packet done indications to generate a packet done indication, wherein the packet done indication is not generated during a time that either the first or the second decoder is decoding a sub-packet of the packet but rather is generated only after both the first packet done indication has been received from the first decoder and the second packet done indication has been received from the second decoder, wherein each packet done indication includes a done signal and an end-of-packet signal, wherein the done signal and the end-of-packet signal are present on at least one conductor extending from a decoder and into the control circuit.

56. An apparatus comprising:

means for controlling a first decoder such that the first decoder decodes a sequence of first sub-packets, wherein some of first sub-packets are of a first packet and others of the first sub-packets are of a second packet, and generates a first packet done indication upon the first decoder completing decoding all the first sub-packets of the first packet;

means for controlling a second decoder such that the second decoder decodes a sequence of second sub-packets, wherein some of second sub-packets are of a first packet and others of the second sub-packets are of a second packet, and generates a second packet done indication upon the second decoder completing decoding all the second sub-packets of the first packet; and means for controlling a control circuit such that the control circuit uses the first and second packet done indications to generate a packet done indication, wherein the packet done indication is not generated during a time that either the first or the second decoder is decoding a sub-packet of the packet but rather is generated only after both the first packet done indication has been received from the first decoder and the second packet done indication has been received from the second decoder, wherein each packet done indication includes a done signal and an end-of-packet signal, wherein the done signal and the end-of-packet signal are present on at least one conductor extending from a decoder and into the control circuit.

57. A circuit comprising:

a first decoder that decodes a sequence of first sub-packets, wherein some of first sub-packets are of a first packet and others of the first sub-packets are of a second packet, and generates a first packet done indication upon the first decoder completing decoding all the first sub-packets of the first packet;

a second decoder that decodes a sequence of second sub-packets, wherein some of second sub-packets are of a first packet and others of the second sub-packets are of a second packet, and generates a second packet done indication upon the second decoder completing decoding all the second sub-packets of the first packet; and a control circuit that uses the first and second packet done indications to generate a packet done indication, wherein the packet done indication is not generated during a time that either the first or the second decoder is decoding a sub-packet of the packet but rather is generated only after both the first packet done indication has been received from the first decoder and the second packet done indication has been received from the second decoder, wherein each packet done indication includes a done signal and an end-of-packet signal, wherein the done signal and the end-of-packet signal are present on at least one conductor extending from a decoder and into the control circuit.

* * * * *